(12) United States Patent
He

(10) Patent No.: US 12,154,983 B2
(45) Date of Patent: Nov. 26, 2024

(54) LATERAL DOUBLE-DIFFUSED METAL OXIDE SEMICONDUCTOR DEVICE AND MANUFACTURING METHOD THEREOF, AND ELECTRONIC APPARATUS

(71) Applicant: CSMC TECHNOLOGIES FAB2 CO., LTD., Wuxi (CN)

(72) Inventor: Nailong He, Wuxi (CN)

(73) Assignee: CSMC TECHNOLOGIES FAB2 CO., LTD., Wuxi (CN)

( * ) Notice: Subject to any disclaimer, the term of this patent is extended or adjusted under 35 U.S.C. 154(b) by 386 days.

(21) Appl. No.: 17/639,359

(22) PCT Filed: May 26, 2020

(86) PCT No.: PCT/CN2020/092201
§ 371 (c)(1),
(2) Date: Mar. 1, 2022

(87) PCT Pub. No.: WO2021/051853
PCT Pub. Date: Mar. 25, 2021

(65) Prior Publication Data
US 2022/0302305 A1     Sep. 22, 2022

(30) Foreign Application Priority Data
Sep. 19, 2019 (CN) .......................... 201910884490.9

(51) Int. Cl.
*H01L 29/78* (2006.01)
*H01L 21/265* (2006.01)
(Continued)

(52) U.S. Cl.
CPC .... *H01L 29/7816* (2013.01); *H01L 21/26586* (2013.01); *H01L 21/266* (2013.01); *H01L 29/66681* (2013.01)

(58) Field of Classification Search
CPC .................................................. H01L 29/7816
See application file for complete search history.

(56) References Cited

U.S. PATENT DOCUMENTS 6,693,339 B1 *  2/2004  Khemka ............. H01L 29/0878
                                                          257/493
7,846,789 B2 * 12/2010  Pendharkar ....... H01L 21/76232
                                                          438/296
(Continued)

FOREIGN PATENT DOCUMENTS

CN      101246904 A      8/2008
CN      102097327 A      6/2011
(Continued)

OTHER PUBLICATIONS

PCT International Search Report & Written Opinion (w/ English translation) for corresponding PCT Application No. PCT/CN2020/092201, mailed on Jul. 27, 2020, 10 pages.

(Continued)

*Primary Examiner* — Caleb E Henry
(74) *Attorney, Agent, or Firm* — Dority & Manning, P.A.

(57) ABSTRACT

The present disclosure provides a lateral double-diffused metal oxide semiconductor device and a manufacturing method thereof, and an electronic apparatus. The method includes: providing a semiconductor substrate, and forming a drift region and a body region in the semiconductor substrate; forming a drain region in the drift region, forming a source region in the body region, and forming, on the body region, a gate structure extending to the drift region; implanting ions of a first type, so as to form, at a bottom of the drift region, first ion implantation regions extending along a direction from the gate structure to the drain region; forming, above the first ion implantation regions, a plurality of mutually spaced deep trench structures and fin structures between adjacent ones of the deep trench structures; and (Continued)

implanting ions of a second type in the deep trench structures to form second ion implantation regions.

15 Claims, 5 Drawing Sheets

(51) Int. Cl.
    *H01L 21/266*     (2006.01)
    *H01L 29/66*     (2006.01)

(56) References Cited

U.S. PATENT DOCUMENTS

| | | |
|---|---|---|
| 8,067,800 B2 | 11/2011 | Hsieh |
| 8,723,256 B1 | 5/2014 | Lin et al. |
| 9,954,094 B2 | 4/2018 | Ohtani et al. |
| 2004/0232522 A1 | 11/2004 | Shimizu |
| 2005/0112808 A1 | 5/2005 | Shibib et al. |
| 2008/0093641 A1* | 4/2008 | Ludikhuize ......... H01L 29/0886 257/E29.345 |
| 2014/0225191 A1 | 8/2014 | Lotfi et al. |

FOREIGN PATENT DOCUMENTS

| | | |
|---|---|---|
| CN | 102097484 A | 6/2011 |
| CN | 102129996 A | 7/2013 |
| CN | 103579351 A | 2/2014 |
| CN | 104241383 A | 12/2014 |
| CN | 104377244 A | 2/2015 |
| CN | 105006484 A | 10/2015 |
| CN | 205606205 U | 9/2016 |
| CN | 107221561 A | 9/2017 |
| CN | 107342226 A | 11/2017 |
| CN | 107359116 A | 11/2017 |
| CN | 107425046 A | 12/2017 |
| CN | 107564816 A | 1/2018 |
| CN | 109473476 A | 3/2019 |
| CN | 110047918 A | 7/2019 |
| EP | 1914797 | 4/2008 |
| JP | 2010135658 A | 6/2010 |

OTHER PUBLICATIONS

Cheng et al., "Simulation Study of a Super-Junction Deep-Trench LDMOS With a Trapezoidal Trench," Journal of the Electron Devices Society, Vo. 6, 2018, pp. 1091-1096.

Chinese Office Action for corresponding Application No. CN 201910884490.9—8 pages.

* cited by examiner

LATERAL DOUBLE-DIFFUSED METAL OXIDE SEMICONDUCTOR DEVICE AND MANUFACTURING METHOD THEREOF, AND ELECTRONIC APPARATUS

CROSS-REFERENCES TO RELATED APPLICATIONS

This patent application is a national stage of PCT Patent Application No. PCT/CN2020/092201, entitled "LATERAL DOUBLE-DIFFUSED METAL OXIDE SEMICONDUCTOR DEVICE AND MANUFACTURING METHOD THEREOF, AND ELECTRONIC APPARATUS", filed on May 26, 2020; which claims priority to Chinese patent disclosure No. 201910884490.9, entitled "LATERAL DOUBLE-DIFFUSED METAL OXIDE SEMICONDUCTOR DEVICE AND MANUFACTURING METHOD THEREOF, AND ELECTRONIC APPARATUS" and filed with the Chinese Patent Office on Sep. 19, 2019, the contents of both of which are hereby incorporated by reference in their entirety for all purposes.

TECHNICAL FIELD

The present disclosure relates to the field of semiconductor technologies, and in particular to a lateral double-diffused metal oxide semiconductor (LDMOS) device and a manufacturing method thereof, and an electronic apparatus.

BACKGROUND

During development, there are mainly two types of high-voltage MOS transistors: a vertical double-diffused metal oxide semiconductor (VDMOS) and an LDMOS. Although the VDMOS has small on-resistance and occupies a small layout area, it is of a longitudinal structure and not easily compatible with low-voltage complementary metal oxide semiconductor (CMOS) circuits. However, the LDMOS has better thermal stability and frequency stability, higher gain and durability, lower feedback capacitance and thermal resistance, as well as constant input impedance and a simpler bias circuit, so it has been widely used at present.

In current high-voltage LDMOS devices, conventional structures, for example, Single Resurf (SR, Resurf denotes a reduce surface field technology), Double Resurf (DR), Triple Resurf (TR) and Muti Resurf LDMOS devices, have been widely used. A super-junction (SJ) technology is required to be used, so as to obtain lower on-resistance on the basis of an equal withstand voltage. However, so far the SJ technology has only been fully applied to vertical discrete transistors, such as VDMOSs or insulated gate bipolar translators (IGBTs). When the SJ technology is used in lateral transistors (such as LDMOSs), there are many problems, for example, first of all, how to make the on-resistance lower and make the process simpler and more compatible.

Therefore, there is a need to provide an LDMOS device and a manufacturing method thereof, so as to solve at least part of the above problems.

SUMMARY

According to embodiments of the present application, a manufacturing method of an LDMOS device is provided, the manufacturing method including:

providing a semiconductor substrate, and forming a drift region and a bulk region in the semiconductor substrate;

forming a drain region in the drift region, forming a source region in the bulk region, and forming, on the bulk region, a gate structure extending to the drift region, the drain region and the source region being located on two sides of the gate structure respectively;

implanting ions of a first type in a region of the drift region located between the gate structure and the drain region, so as to form, at a bottom of the drift region, first ion implantation regions extending along a direction from the gate structure to the drain region;

forming, above the first ion implantation regions, a plurality of mutually spaced deep trench structures and fin structures between adjacent ones of the deep trench structures, so as to expose part of the first ion implantation regions through the deep trench structures; and implanting ions of a second type in the deep trench structures to form second ion implantation regions, so that the first ion implantation regions and the second ion implantation regions are arranged alternately, wherein the ions of the first type are different from the ions of the second type.

According to embodiments of the present application, an LDMOS device is further provided, including:

a semiconductor substrate, a drift region and a bulk region being formed in the semiconductor substrate;

a drain region formed in the drift region, a source region formed in the bulk region, and a gate structure extending to the drift region formed on the bulk region, the drain region and the source region being located on two sides of the gate structure respectively;

a plurality of mutually spaced deep trench isolation structures between the gate structure and the drain region and fin structures between adjacent ones of the deep trench isolation structures formed in the drift region;

first ion implantation regions below the fin structures; and second ion implantation regions below the deep trench isolation structures;

wherein the first ion implantation regions and the second ion implantation regions extend along a direction from the gate structure to the drain region, and ions in the first ion implantation regions are of different types from ions in the second ion implantation regions.

According to embodiments of the present application, an electronic apparatus is further provided, including any one of the LDMOS devices described above.

Details of one or more embodiments of the present application are set forth in the following accompanying drawings and descriptions. Other features, objectives, and advantages of the present application become obvious with reference to the specification, the accompanying drawings, and the claims.

BRIEF DESCRIPTION OF THE DRAWINGS

In order to better describe and illustrate embodiments and/or examples of those applications disclosed herein, reference may be made to one or more accompanying drawings. Additional details or examples used to describe the accompanying drawings should not be considered as limitations on the scope of any of the disclosed applications, the presently described embodiments and/or examples, and the presently understood best mode of these applications.

DETAILED DESCRIPTION OF THE EMBODIMENTS

In order to understand the present disclosure thoroughly, detailed structures and steps will be given in the following descriptions to explain the technical solutions according to the present disclosure. Preferred embodiments of the present disclosure are described in detail as follows. However, the present disclosure may have other implementations in addition to these detailed descriptions.

A manufacturing method of an LDMOS device according to the present disclosure is described below with reference to FIG. 1A to FIG. 1D.

It is to be noted that, for the LDMOS device according to the present disclosure, its drift region, bulk region, gate structure, source region, drain region and other structures are all formed with a conventional manufacturing method of an LDMOS device, which are not described in detail herein. A method of forming an SJ of the LDMOS device according to the present disclosure is mainly described below.

As shown in FIG. 3 and FIG. 1A to FIG. 1D, a manufacturing method of an LDMOS device includes the following steps.

In step S1, a semiconductor substrate is provided, and a drift region and a bulk region are formed in the semiconductor substrate.

In step S2, a drain region is formed in the drift region, a source region is formed in the bulk region, and a gate structure extending to the drift region is formed on the bulk region, the drain region and the source region being located on two sides of the gate structure respectively.

In step S3, ions of a first type are implanted in a region of the drift region located between the gate structure and the drain region, so as to form, at a bottom of the drift region, first ion implantation regions extending along a direction from the gate structure to the drain region.

In step S4, a plurality of mutually spaced deep trench structures and fin structures between adjacent ones of the deep trench structures are formed above the first ion implantation regions, so as to expose part of the first ion implantation regions through the deep trench structures.

In step S5, ions of a second type are implanted in the deep trench structures to form second ion implantation regions, so that the first ion implantation regions and the second ion implantation regions are arranged alternately, wherein the ions of the first type are different from the ions of the second type.

In one embodiment, the manufacturing method further includes the following step.

In step S6, the ions of the second type are implanted in sidewalls of the fin structures, so as to form sidewall ion implantation regions on the sidewalls of the fin structures.

The method is described in further detail below with reference to FIG. 1A to FIG. 1D.

Figure 1A:
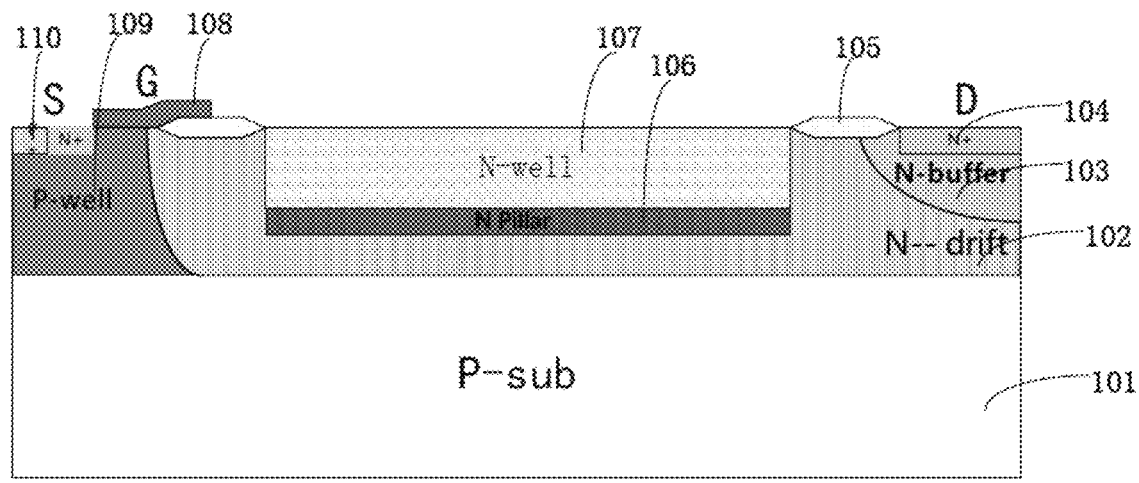
FIG. 1A to FIG. 1D are schematic sectional views of a device obtained by sequentially performing steps of a manufacturing method of an LDMOS device according to an implementation of the present disclosure.

Firstly, in step S1, as shown in FIG. 1A, a semiconductor substrate 101 is provided, a drift region 102 and a bulk region 109 are in the semiconductor substrate, and side surfaces of the drift region 102 and the bulk region 109 are in contact with each other.

Specifically, the semiconductor substrate 101 may be made of at least one of the following materials: silicon, a silicon on insulator (SOI), a stacked silicon on insulator (SSOI), a stacked silicon germanium on insulator (S—SiGeOI), a silicon germanium on insulator (SiGeOI), a germanium on insulator (GeOI), and the like.

In an example of the present disclosure, the semiconductor substrate is a P-type semiconductor substrate.

The drift region 102 is an N-type drift region, the bulk region 109 is a P-type bulk region, and the drift region 102 and the bulk region 109 may be formed by, for example, ion implantation.

In step S2, a drain region 104 is formed in the drift region 102, a source region is formed in the bulk region, and a gate structure 108 extending to the drift region is formed on the bulk region. The drain region 104 and the source region are located on two sides of the gate structure 108 respectively.

Specifically, as shown in FIG. 1A, a local oxide layer isolation structure 105 (i.e., field oxide or FOX) having a thickness greater than 0.5 microns is formed in a region of the drift region between the bulk region 109 and a position where the drain region 104 is to be formed subsequently, for playing a role of isolation. A specific implementation method thereof involves forming, through high-temperature treatment, the oxide layer isolation structure 105 having a thickness greater than 0.5 microns between the bulk region 109 and the position where the drain region 104 is to be formed subsequently, and then forming N-type implantation regions and P-type implantation regions through high-energy implantation to respectively form the drain region, the source region and a body lead-out region 110. The local oxide layer isolation structure 105 is also etched to arrange a window on the local oxide layer isolation structure 105 to expose the drift region 102 below. A region defined by the window is a region where first ion implantation regions are formed subsequently.

The device further includes a gate structure 108. The gate structure 108 may be a polysilicon gate or a metal gate. A manufacturing method of the gate structure 108 may include depositing and patterning a gate material layer to form a gate.

After the gate structure 108 is formed, source-drain implantation is then performed to form the source region and the drain region 104. An N-type buffer region 103 is further formed in the drift region, and the drain region 104 is formed in the buffer region 103.

In step S3, as shown in FIG. 1A, ions of a first type are implanted in a region of the drift region 102 located between the gate structure and the drain region, so as to form, at a bottom of the drift region, first ion implantation regions 106 extending along a direction from the gate structure to the drain region.

Specifically, as shown in FIG. 1A, the method of forming the first ion implantation regions 106 in the step includes the following steps.

In step S31, a mask layer is formed on the drift region 102 for defining a region where first ion implantation regions and second ion implantation regions are alternately formed subsequently.

The mask layer may be a conventional mask layer, such as a photoresist layer, which is easier to remove.

In step S32, ion implantation is performed with the mask layer as a mask, so as to form first ion implantation regions 106 at a bottom of the drift region.

In the step, the first ion implantation regions 106 extend along a direction from the gate structure to the drain region.

In a specific implementation of the present disclosure, the ions of the first type are N-type, and thus the first ion implantation regions 106 are N-type.

Depths of the first ion implantation regions 106 are controlled by controlling energy of implantation of the ions of the first type, so as to ensure that the first ion implantation regions 106 are located in a bottom region of the drift region. For example, their lengths from the bottom of the drift region are within one third of a depth of the entire drift region.

Optionally, the ions of the first type are continuously implanted, so as to form a well region 107 of the ions of the first type above the first ion implantation regions.

In step S4, a plurality of mutually spaced deep trench structures and fin structures between adjacent ones of the deep trench structures are formed above the first ion implantation regions, so as to expose part of the first ion implantation regions through the deep trench structures.

Figure 1B:
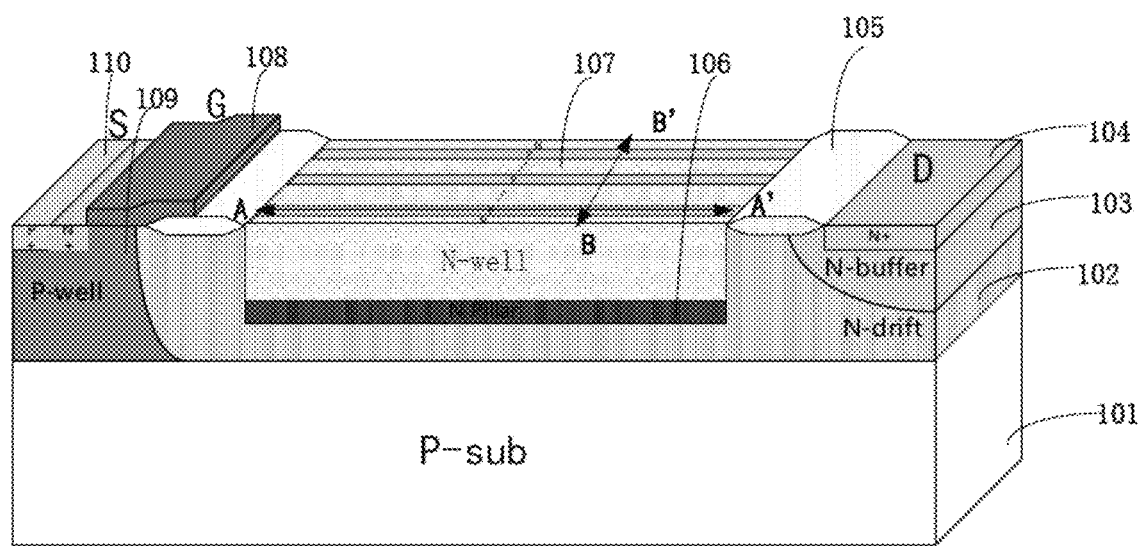
Figure 1C:
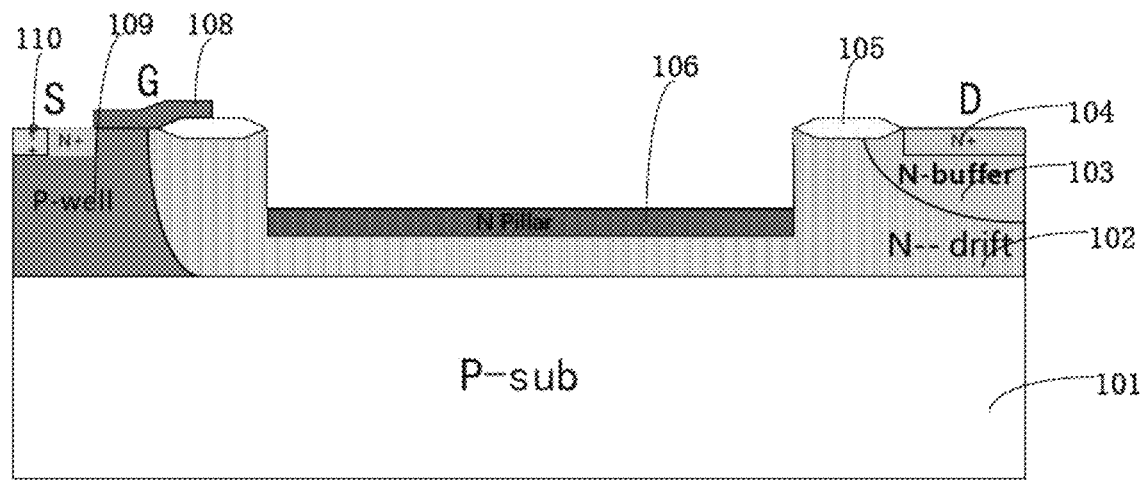

As shown in FIG. 1B and FIG. 1C, a mask layer is first formed in the step, for defining a region where the second ion implantation regions are formed.

The mask layer may be a conventional mask layer, such as a photoresist layer, which is easier to remove.

Then, the well region 107 above the first ion implantation regions is etched by taking the mask layer as a mask, so as to form a plurality of deep trench structures. The plurality of deep trench structures extend along a direction from the gate structure to the drain region, and the plurality of deep trench structures are spaced from each other.

Optionally, protruding fin structures are formed in the well region 107 between the deep trench structures while the deep trench structures are formed. Sidewalls of the fin structures define contours of the deep trench structures.

In step S5, ions of a second type are implanted in the deep trench structures to form second ion implantation regions, so that the first ion implantation regions and the second ion implantation regions are arranged alternately, wherein the ions of the first type are different from the ions of the second type.

Figure 1D:
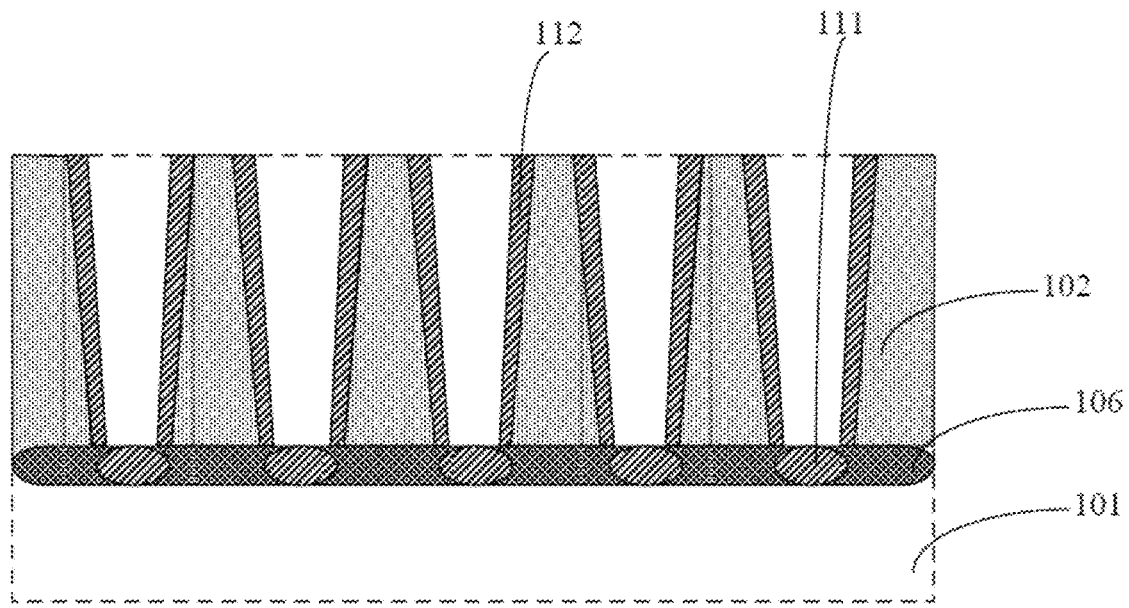

In the step, ion implantation is performed with the fin structures as masks, so as to form second ion implantation regions 111 at bottoms of the deep trench structures, as shown in FIG. 1D.

In the step, the second ion implantation regions 111 extend along a direction from the gate structure to the drain region.

In a specific implementation of the present disclosure, the ions of the second type are implanted vertically downwards, and the first ion implantation regions exposed at the bottoms of the deep trench structures may be inverted, so as to form the second ion implantation regions 111 at the bottom of the drift region. The first ion implantation regions and the second ion implantation regions have a same height, so that the first ion implantation regions and the second ion implantation regions are arranged alternately.

The ions of the second type are P-type, and thus the second ion implantation regions 111 are P-type. Therefore, alternate N—P—N—P ion implantation regions are formed.

In the step, the second ion implantation regions 111 are controlled to be located on bottom surfaces of the deep trench structures by controlling energy of implantation of the ions of the second type. In the present application, the ions of the first type of a large area are implanted first, the spaced deep trench structures and the fin structures are then formed, the ions of the second type are implanted in the deep trench structures, and the first ion implantation regions and the second ion implantation regions arranged alternately are formed at the bottom of the drift region, so as to form an SJ at the bottom of the drift region.

In step S6, the ions of the second type are implanted in sidewalls of the fin structures, so as to form sidewall ion implantation regions 112 on the sidewalls of the fin structures.

In the step, the ions of the second type are implanted in the sidewalls of the fin structures to form additional sidewall ion implantation regions 112. The ions of the second type are implanted in the sidewalls of the fin structures by inclined implantation, so as to form the sidewall ion implantation regions on the sidewalls of the fin structures. The well region between the deep trench structures is completely depleted through the sidewall ion implantation regions on two sides during resistance to voltage. The concentration of the well region is much higher than that of the drift region, so that the on-resistance is further reduced on the basis of an SJ LDMOS. In the structure, an SJ and the sidewall ion implantation regions (sidewall) simultaneously act on the drift region, which reduces surface electric fields and improves conductivity, resulting in formation of a trench 3D RESURF LDMOS.

In the invention, "inclined implantation" means implanting the ions of the second type in the sidewalls of the fin structures at an inclined implantation angle. For example, in a specific embodiment of the present disclosure, implantation directions of the ions and the sidewalls of the fin structures are at an angle less than 90 degrees, so as to more effectively form the sidewall ion implantation regions.

Finally, the deep trench structures are filled with a medium, to form deep trench isolation structures (DTIs).

Figure 2A:
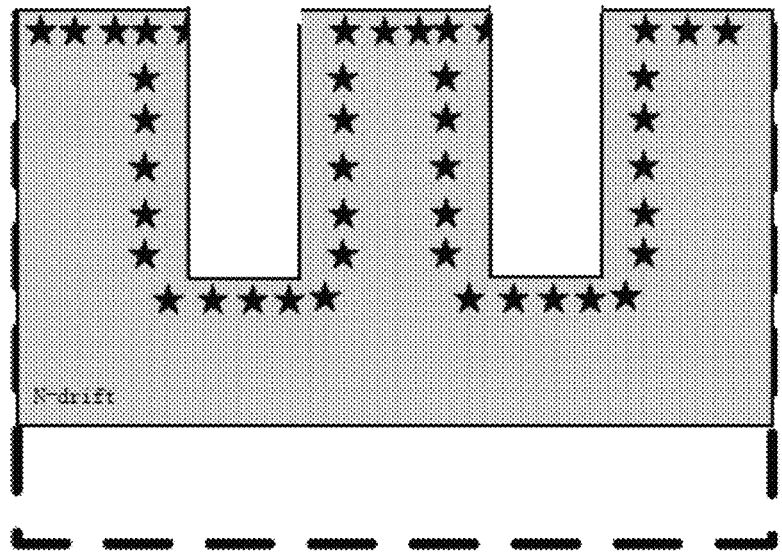
FIG. 2A is a schematic cross-sectional view of a current flow direction of an LDMOS device according to an implementation of the present disclosure.
Figure 2B:
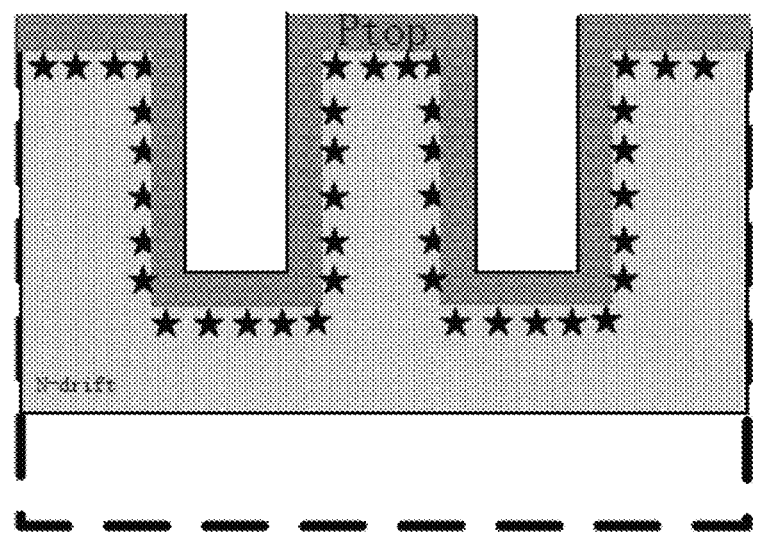
FIG. 2B is a schematic cross-sectional view of a current flow direction of an LDMOS device according to another implementation of the present disclosure.
Figure 2C:
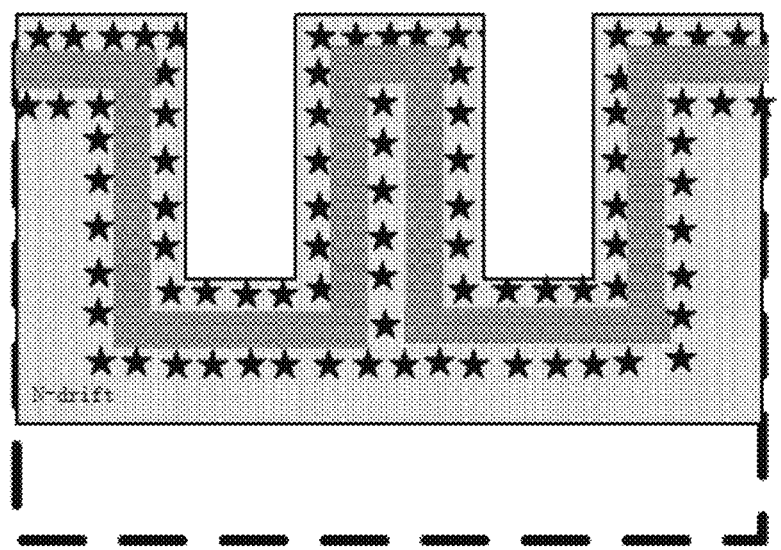
FIG. 2C is a schematic cross-sectional view of a current flow direction of an LDMOS device according to still another implementation of the present disclosure.
Figure 3:
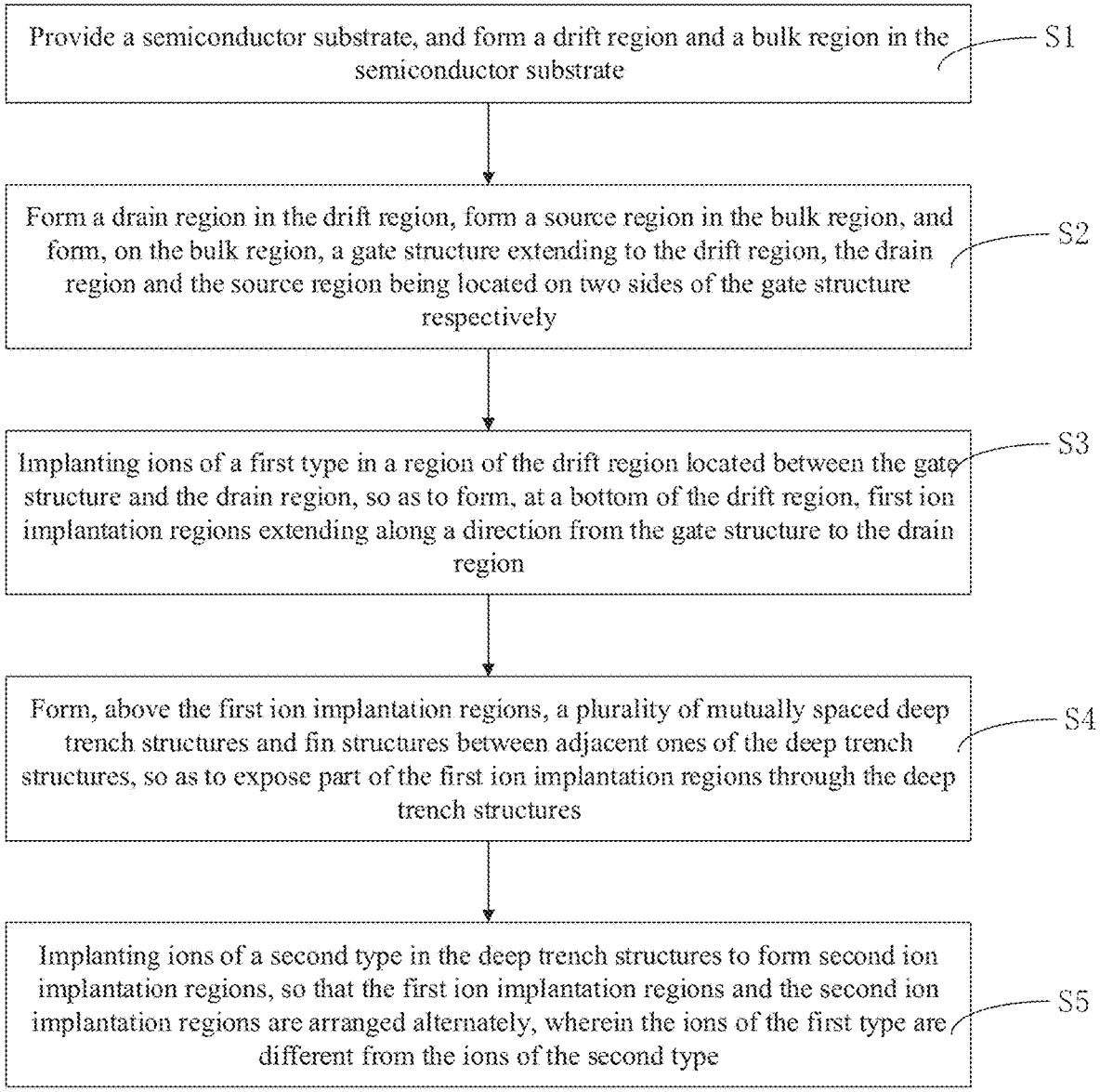
FIG. 3 is a flowchart of steps of a manufacturing method of an LDMOS device according to another implementation of the present disclosure.

Optionally, in the present disclosure, the LDMOS device may be one of SR, DR, TR, and muti Resurf LDMOS devices. For example, when the device is an SR device, no top implantation layer is provided, and a flow direction of a current thereof is as shown in FIG. 2A. Density of the current from a surface to a body becomes smaller and smaller, and the current mainly flows on the surface. Since the density of the current becomes smaller and smaller from top to bottom, most of the current flows through a surface channel. If the surface is fin-shaped, a surface channel path is increased and on-impedance is correspondingly reduced. When the device is a DR device, as shown in FIG. 2B, top implantation regions are formed at tops of the fin structures. Similarly, density of the current becomes smaller and smaller from top to bottom, and most of the current flows through a surface channel. If the surface is fin-shaped, a surface channel path is increased and on-impedance is correspondingly reduced. When the device is a TR device, as shown in FIG. 2C, buried implantation regions are formed below the tops of the fin structures. The buried implantation regions drive into the drift region. The current has upper and lower paths. Similarly, nearly half of the current is above the buried implantation regions (Pbury), and most of the current below the buried implantation regions (Pbury) is concentrated in a region close to the buried implantation regions (Pbury). If the surface is fin-shaped, a surface channel path is increased and on-impedance is correspondingly reduced.

The structure of the LDMOS device according to the present disclosure is described in detail below.

As shown in FIG. 1C and FIG. 1D, the LDMOS device includes:

a semiconductor substrate 101, a drift region 102 and a bulk region 109 being formed in the semiconductor substrate;

a drain region 104 formed in the drift region, a source region formed in the bulk region, and a gate structure 108 extending to the drift region 102 formed on the bulk region 109, the drain region 104 and the source region being located on two sides of the gate structure 108 respectively;

a plurality of mutually spaced DTIs between the gate structure and the drain region and fin structures between adjacent ones of the DTIs formed in the drift region;

first ion implantation regions 106 below the fin structures; and second ion implantation regions 111 below the DTIs;

wherein the first ion implantation regions and the second ion implantation regions extend along a direction from the gate structure to the drain region, and ions in the first ion implantation regions are of different types from ions in the second ion implantation regions.

In one embodiment, the device may further include sidewall ion implantation regions 112 located on sidewalls of the fin structures, and ions in the sidewall ion implantation regions 112 are of a same type as the ions in the second ion implantation regions 111.

Specifically, an N-type drift region 102 is formed on the semiconductor substrate 101, and a P-type well region is formed in the semiconductor substrate 101 as a P-type bulk region 109 (P-body). A P+ implantation region and an N+ implantation region are formed in the bulk region 109, the P+ implantation region is used as the body lead-out region 110, and the N+ implantation region is used as the source region.

An N+ drain region 104 spaced from the P-type well region is further formed in the N-type drift region 102. An N-type buffer region 103 is further formed in the drift region, and the drain region 104 is formed in the buffer region 103.

The gate structure 108 is further formed on the bulk region. The gate structure 108 may be a polysilicon gate or a metal gate.

The local oxide layer isolation structure 105 (i.e., field oxide or FOX) having a thickness greater than 0.5 microns is formed in a region of the drift region between the gate structure 108 and the drain region 104, for playing a role of isolation. The local oxide layer isolation structure 105 is provided with a window exposing the drift region 102 below.

The SJ includes the first ion implantation regions 106 and the second ion implantation regions 111 arranged alternately. The first ion implantation regions 106 are N-type implantation regions, and the second ion implantation regions 111 are P-type implantation regions. The P-type implantation regions and the N-type implantation regions extend along a direction from the gate structure to the drain region. When the device is in an off state, the P-type implantation regions and the N-type implantation regions deplete each other to achieve high voltage resistance, so that the on-resistance can be reduced by increasing doping concentrations of the P-type implantation regions and the N-type implantation regions simultaneously.

To further reduce the on-resistance by using the SJ technology, DTIs and fin structures are formed in the N-type drift region 102. The first ion implantation regions 106 are at bottoms of the fin structures, and the second ion implantation regions 111 are at bottoms of the DTIs. Lengths of the first ion implantation regions from the bottom of the drift region are within one third of a depth of the drift region, and the first ion implantation regions and the second ion implantation regions have a same height.

Further, an N-type well region is formed above the first ion implantation regions in the N-type drift region 102, and the DTIs and the fin structures are formed in the N-type well region.

The sidewall ion implantation regions 112 are formed on the sidewalls of the fin structures. Ions in the first ion implantation regions are of different types from ions in the second ion implantation regions, and ions in the sidewall ion implantation regions 112 are of a same type as the ions in the second ion implantation regions 111.

The sidewall ion implantation regions are formed on the sidewalls of the fin structures. The well region between the DTIs is completely depleted through the sidewall ion implantation regions on two sides during resistance to voltage. The concentration of the well region is much higher than that of the drift region, so that the on-resistance is further reduced on the basis of the SJ LDMOS. In the structure, an SJ and the sidewall ion implantation regions (sidewall) simultaneously act on the drift region, which reduces surface electric fields and improves conductivity, resulting in formation of a trench 3D RESURF LDMOS.

Optionally, in the present disclosure, the LDMOS device may be one of SR, DR, TR, and muti Resurf LDMOS devices. For example, when the device is an SR device, no top implantation layer is provided, and a flow direction of a current thereof is as shown in FIG. 2A. Density of the current from a surface to a body becomes smaller and smaller, and the current mainly flows on the surface. Since the density of the current becomes smaller and smaller from top to bottom, most of the current flows through a surface channel. If the surface is fin-shaped, a surface channel path is increased and on-impedance is correspondingly reduced. When the device is a DR device, as shown in FIG. 2B, top implantation regions are formed at tops of the fin structures. Similarly, density of the current becomes smaller and smaller from top to bottom, and most of the current flows through a surface channel. If the surface is fin-shaped, a surface channel path is increased and on-impedance is correspondingly reduced. When the device is a TR device, as shown in FIG. 2C, buried implantation regions are formed below the tops of the fin structures. The buried implantation regions drive into the drift region. The current has upper and lower paths. Similarly, nearly half of the current is above the buried implantation regions (Pbury), and most of the current below the buried implantation regions (Pbury) is concentrated in a region close to the buried implantation regions (Pbury). If the surface is fin-shaped, a surface channel path is increased and on-impedance is correspondingly reduced.

The technical features in the above embodiments may be randomly combined. For concise description, not all possible combinations of the technical features in the above embodiments are described. However, all the combinations of the technical features are to be considered as falling within the scope described in this specification provided that they do not conflict with each other.

The above embodiments only describe several implementations of the present application, and their description is specific and detailed, but cannot therefore be understood as a limitation on the patent scope of the application. It should be noted that those of ordinary skill in the art may further make variations and improvements without departing from the conception of the present application, and these all fall within the protection scope of the present application. Therefore, the patent protection scope of the present application should be subject to the appended claims.

What is claimed is:

1. A manufacturing method of a lateral double-diffused metal oxide semiconductor device, comprising:
   step S1: providing a semiconductor substrate, and forming a drift region and a bulk region in the semiconductor substrate;
   step S2: forming a drain region in the drift region, forming a source region in the bulk region, and forming, on the bulk region, a gate structure extending to the drift region, the drain region and the source region being located on two sides of the gate structure respectively;
   step S3: implanting ions of a first type in a region of the drift region located between the gate structure and the drain region, so as to form, at a bottom of the drift region, first ion implantation regions extending along a direction from the gate structure to the drain region;
   step S4: forming, above the first ion implantation regions, a plurality of mutually spaced deep trench structures and fin structures between adjacent ones of the deep trench structures, so as to expose part of the first ion implantation regions through the deep trench structures; and
   step S5: implanting ions of a second type in the deep trench structures to form second ion implantation regions, so that the first ion implantation regions and the second ion implantation regions are arranged alternately, wherein the ions of the first type are different from the ions of the second type.

2. The manufacturing method according to claim 1, further comprising:
   step S6: implanting the ions of the second type in sidewalls of the fin structures, so as to form sidewall ion implantation regions on the sidewalls of the fin structures.

3. The manufacturing method according to claim 1, wherein the ions of the first type are N-type, and the ions of the second type are P-type.

4. The manufacturing method according to claim 1, wherein the process of forming the first ion implantation regions comprises:
   forming a mask layer on the drift region between the gate structure and the drain region, so as to define a region of the first ion implantation regions;
   implanting the ions of the first type, so as to form the first ion implantation regions; and
   continuously implanting the ions of the first type, so as to form a well region of the ions of the first type above the first ion implantation regions.

5. The manufacturing method according to claim 1, further comprising:
   implanting the ions of the second type at tops of the fin structures, so as to form top implantation regions at the tops of the fin structures or form buried implantation regions below the tops of the fin structures.

6. The manufacturing method according to claim 2, wherein the process of forming the sidewall ion implantation regions comprises: implanting the ions of the second type in the sidewalls of the fin structures at an inclined implantation angle.

7. A lateral double-diffused metal oxide semiconductor device, comprising:
   a semiconductor substrate, a drift region and a bulk region being formed in the semiconductor substrate;
   a drain region formed in the drift region, a source region formed in the bulk region, and a gate structure extending to the drift region formed on the bulk region, the drain region and the source region being located on two sides of the gate structure respectively;
   a plurality of mutually spaced deep trench isolation structures between the gate structure and the drain region and fin structures between adjacent ones of the deep trench isolation structures formed in the drift region;
   first ion implantation regions below the fin structures; and
   second ion implantation regions below the deep trench isolation structures; wherein the first ion implantation regions and the second ion implantation regions extend along a direction from the gate structure to the drain region, and ions in the first ion implantation regions are of different types from ions in the second ion implantation regions.

8. The lateral double-diffused metal oxide semiconductor device according to claim 7, further comprising sidewall ion implantation regions located on sidewalls of the fin structures, ions in the sidewall ion implantation regions being of a same type as the ions in the second ion implantation regions.

9. The lateral double-diffused metal oxide semiconductor device according to claim 7, wherein the first ion implantation regions and the sidewall ion implantation regions are N-type, and the second ion implantation regions are P-type.

10. The lateral double-diffused metal oxide semiconductor device according to claim 7, further comprising top implantation regions at tops of the fin structures or buried implantation regions below the tops of the fin structures, the top implantation regions or buried implantation regions being P-type.

11. The lateral double-diffused metal oxide semiconductor device according to claim 7, wherein an N-type well region is formed above the first ion implantation regions, and the fin structures are formed in the N-type well region.

12. The lateral double-diffused metal oxide semiconductor device according to claim 7, further comprising a local oxide layer isolation structure located on the drift region and located in a region between the gate structure and the drain region.

13. The lateral double-diffused metal oxide semiconductor device according to claim 7, wherein lengths of the first ion implantation regions from the bottom of the drift region are within one third of a depth of the drift region, and the first ion implantation regions and the second ion implantation regions have a same height.

14. The lateral double-diffused metal oxide semiconductor device according to claim 7, wherein a buffer region is further formed in the drift region, and the drain region is formed in the buffer region.

15. An electronic apparatus, comprising the lateral double-diffused metal oxide semiconductor device according to claim 7.

* * * * *